(12) United States Patent
Schultz et al.

(10) Patent No.: US 11,275,106 B2
(45) Date of Patent: Mar. 15, 2022

(54) HIGH VOLTAGE PROBE CARD SYSTEM

(71) Applicant: CELADON SYSTEMS, INC., Burnsville, MN (US)

(72) Inventors: Adam J. Schultz, Burnsville, MN (US); William A. Funk, Lakeville, MN (US); Bryan J. Root, Apple Valley, MN (US)

(73) Assignee: CELADON SYSTEMS, INC., Burnsville, MN (US)

( * ) Notice: Subject to any disclaimer, the term of this patent is extended or adjusted under 35 U.S.C. 154(b) by 151 days.

(21) Appl. No.: 16/594,443

(22) Filed: Oct. 7, 2019

(65) Prior Publication Data

US 2020/0110126 A1    Apr. 9, 2020

Related U.S. Application Data

(60) Provisional application No. 62/741,983, filed on Oct. 5, 2018.

(51) Int. Cl.
| | | |
|---|---|---|
| *G01R 31/00* | (2006.01) | |
| *G01R 31/26* | (2020.01) | |
| *G01R 31/28* | (2006.01) | |
| *G01R 1/04* | (2006.01) | |
| *G01R 1/067* | (2006.01) | |
| *G01R 1/073* | (2006.01) | |
| *G01R 1/44* | (2006.01) | |

(52) U.S. Cl.
CPC ..... *G01R 31/2601* (2013.01); *G01R 1/07364* (2013.01); *G01R 1/44* (2013.01); *G01R 31/2889* (2013.01)

(58) Field of Classification Search
CPC ........ G01R 31/00; G01R 31/02; G01R 31/26; G01R 31/28; G01R 1/04; G01R 1/0466; G01R 1/067; G01R 1/073; G01R 1/44
See application file for complete search history.

(56) References Cited

U.S. PATENT DOCUMENTS

| | | | | |
|---|---|---|---|---|
| 5,148,103 | A * | 9/1992 | Pasiecznik, Jr. ...... | G01R 1/0735 324/754.08 |
| 6,388,458 | B1 * | 5/2002 | Hembree ............. | G01R 1/0466 324/756.02 |
| 2008/0048700 | A1 * | 2/2008 | Lou ......................... | G01R 1/44 324/750.08 |
| 2014/0225636 | A1 * | 8/2014 | Root .................... | G01R 1/0466 324/750.24 |

* cited by examiner

*Primary Examiner* — Neel D Shah
(74) *Attorney, Agent, or Firm* — Hamre, Schumann, Mueller & Larson, P.C.

(57) ABSTRACT

A test assembly for testing a device under test includes a probe card assembly and a cap secured to the probe card assembly. The probe card assembly includes a probe tile having a plurality of openings. The probe tile includes a plurality of probe wires including a probe needle portion and a probe tip portion. A seal is disposed on a surface of the probe tile and forms an outer perimeter of a pressurized area. The probe tile includes an insulation layer formed within the pressurized area that is configured to separate the probe needle portion from the device under test. The insulation layer includes an aperture through which the probe tip portion extends to contact the device under test. The cap includes a fluid inlet and a fluid return outlet that are in fluid communication with the plurality of openings of the probe tile.

20 Claims, 6 Drawing Sheets

HIGH VOLTAGE PROBE CARD SYSTEM

FIELD

This disclosure relates generally to test equipment and systems for a device under test, such as, but not limited to, a semiconductor device. More specifically, this disclosure relates to systems and apparatuses including a probe card usable with other test equipment for electrically testing a semiconductor device, such as a semiconductor wafer or a micro-electrical-mechanical systems (MEMS) device.

BACKGROUND

The semiconductor industry continues to have a need to access many electronic devices on a semiconductor wafer. As the semiconductor industry grows and devices become smaller and more complex, many electrical devices, most commonly semiconductor devices and on-wafer electrical interconnects, must be electrically tested, for example, for leakage currents and extremely low operating currents while the devices are in wafer form. In addition, the currents and device characteristics are often required to be evaluated over a wide temperature and voltage range to understand how temperature and voltage affects a device. Also, due to continuous and rapid changes in semiconductor technology, the size of semiconductor devices and their electrical contact pads keeps getting smaller.

To effectively measure semiconductor devices in wafer form, probes are used to contact conductive pads on the surface of the wafer. These probes are, in turn, electrically connected to test instruments. Often, additional electrical interconnection components such as circuit boards make up part of the connection between the probes and test instruments. To minimize degradation of electrical measurements, the probes and interconnection components must be designed to isolate the measurement signal from external electrical interference, leakage currents through dielectric materials, parasitic capacitance, triboelectric noise, piezo-electric noise, and dielectric absorption, etc.

Accordingly, there continues to be a need for improved semiconductor test equipment for electrically probing semi-conductor devices, such as semiconductor wafers.

SUMMARY

This disclosure relates generally to test equipment and systems for a device under test, such as, but not limited to, a semiconductor device. More specifically, this disclosure relates to systems and apparatuses including a probe card usable with other test equipment for electrically testing a semiconductor device, such as a semiconductor wafer or a micro-electrical-mechanical systems (MEMS) device.

In an embodiment, the systems and apparatuses disclosed herein can be used for high voltage testing of a device under test. In an embodiment, a high voltage test can include application of at or about 300 volts or an application of greater than 300 volts. In an embodiment, the high voltage test can include an application of greater than 300 volts up to at or about 50,000 volts.

Test equipment is described that is useful, for example, in systems to test a semiconductor device. More particularly, a probe apparatus is described that can be used to electrically probe a semiconductor device, such as a semiconductor wafer. Generally, the probe apparatus includes a probe core that can be locked and unlocked with respect to another test equipment or component, such as a circuit board, and where the probe core has one or more probes that can probe the device and are electrically connected to contacts that can transmit signals from the probe core, for example, to other testing equipment.

In an embodiment, the probe core probes can be wire needles that can have electrical connections and contacts to other testing equipment.

A test assembly for testing a device under test is disclosed. The test assembly includes a probe card assembly and a cap secured to the probe card assembly. The probe card assembly includes a probe tile. The probe tile includes a plurality of openings. The probe tile includes a plurality of probe wires including a probe needle portion and a probe tip portion. A seal is disposed on a surface of the probe tile. The seal forms an outer perimeter of a pressurized area. The probe tile includes an insulation layer formed within the pressurized area. The insulation layer is configured to separate the probe needle portion from the device under test. The insulation layer includes an aperture through which the probe tip portion extends to contact the device under test. The cap includes a fluid inlet and a fluid return outlet. The fluid inlet and the fluid return outlet are in fluid communication with the plurality of openings of the probe tile.

In an embodiment, the insulation layer of the test assembly can be made of a material compatible with the materials of the test assembly and capable of preventing a spark from forming between electrical components. In an embodiment, the insulation layer can be a polyimide sheet or the like.

In an embodiment, the test assembly is fluidly connected to a fluid source that is configured to provide a temperature controlled fluid. In an embodiment, the temperature controlled fluid can be from at or about −65° C. to at or about 300° C. In an embodiment, the temperature of the controlled fluid can be selected based on, for example, a desired testing temperature for testing the device under test.

A method of probing devices under test is also disclosed. The method includes positioning a probe card assembly into a test position, which includes retaining a cap to the probe card assembly. A temperature controlled fluid is provided from a fluid source to a fluid inlet of the cap, the fluid inlet in fluid communication with one or more apertures in the probe card assembly, thereby forming a fluid pocket at the test position between the probe card assembly and the device under test. The device under test is probed. Signals are transmitted to a test equipment by way of contact of the probe card assembly with a circuit board and of contact of the probe card assembly with the device under test, thereby allowing signals to be transferred through the probe wires and circuit board.

BRIEF DESCRIPTION OF THE DRAWINGS

References are made to the accompanying drawings that form a part of this disclosure, and which illustrate embodiments in which the systems and methods described in this specification can be practiced.

Like reference numbers represent like parts throughout.

DETAILED DESCRIPTION

This disclosure relates generally to test equipment and systems for a device under test, such as, but not limited to, a semiconductor device. More specifically, this disclosure relates to systems and apparatuses including a probe card usable with other test equipment for electrically testing a semiconductor device, such as a semiconductor wafer or a micro-electrical-mechanical systems (MEMS) device.

The test equipment and systems described herein may be especially suited for testing of a device under test that includes application of high voltages.

Devices under test, such as semiconductor devices, may be tested by applying high voltage to semiconductor components such as, but not limited to, transistors, diodes, or the like. When conducting the testing, there are a number of semiconductor components that may be present nearby each other. When applying high voltages (e.g., at or about 300 volts or greater than 300 volts) to these components, there is a risk of spark generation that can discharge in the air. Improved ways of reducing risk of sparking are desirable. It is to be appreciated that these voltage ranges are examples and can vary beyond the stated range. In an embodiment, the voltage applied can be up to at or about 50,000 volts.

Embodiments of this disclosure provide a test assembly for a device under test that includes a pressurization of an area being tested using a temperature and pressure controlled fluid flow.

In an embodiment, the fluid may be a temperature controlled fluid flow.

In an embodiment, the fluid may be a temperature controlled and a pressure controlled fluid flow. In an embodiment, controlling both the temperature and the pressure may enhance the repeatability and accuracy of the testing process.

In an embodiment, a risk of sparking can be reduced as a result of the temperature and pressure controlled fluid flow.

Figure 1A:
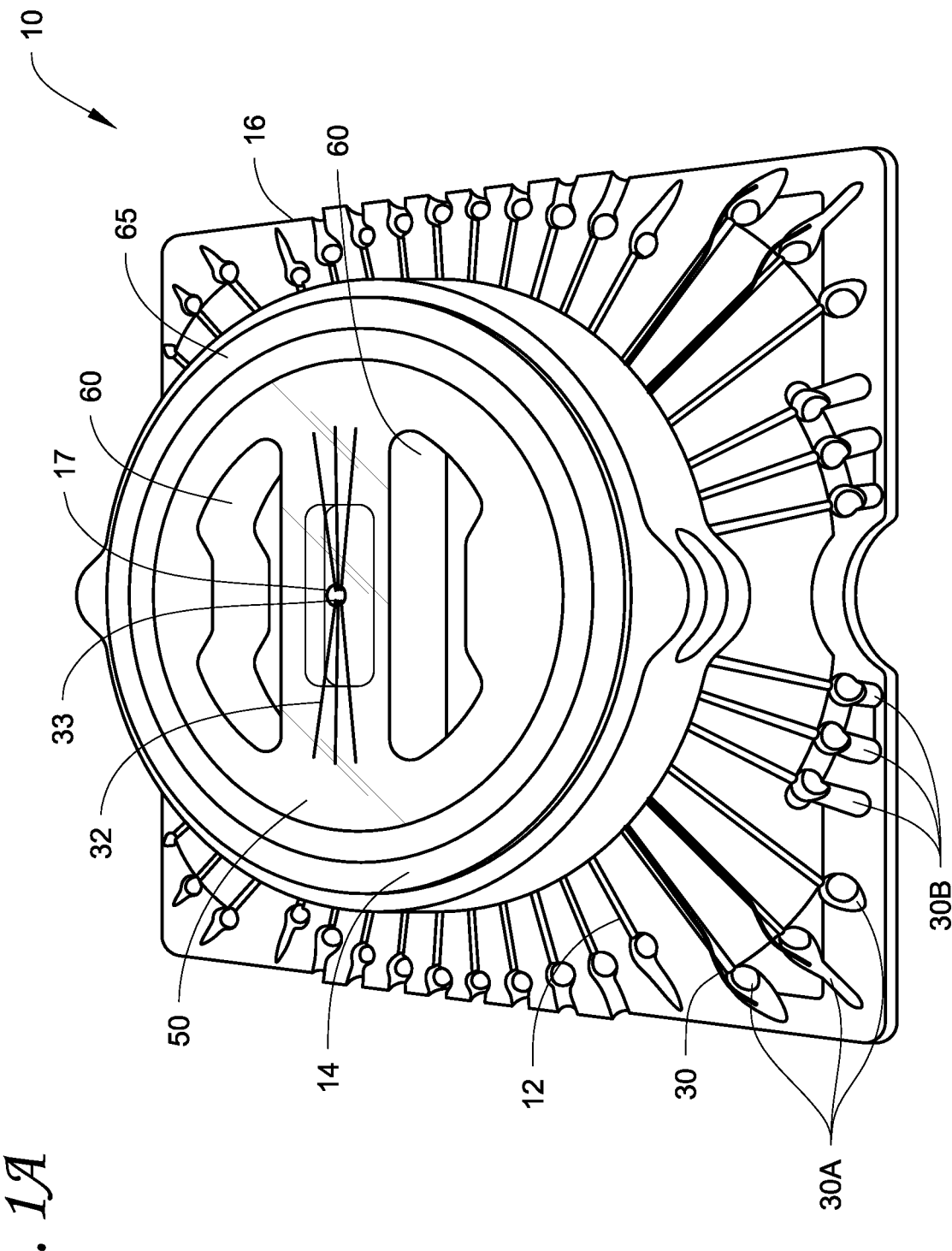
FIGS. 1A-1C illustrate views of a probe card assembly, according to an embodiment.
Figure 1B:
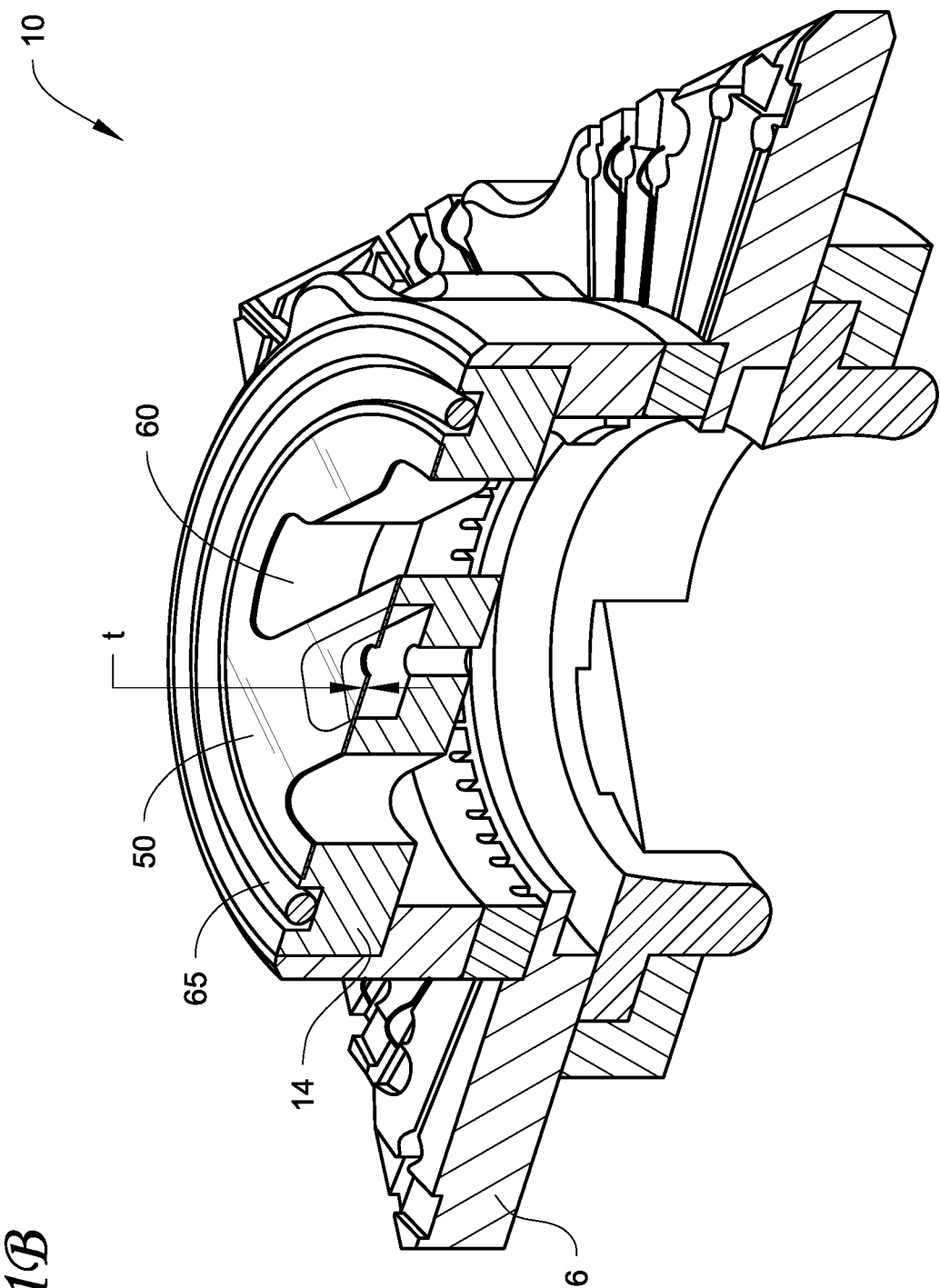
Figure 1C:
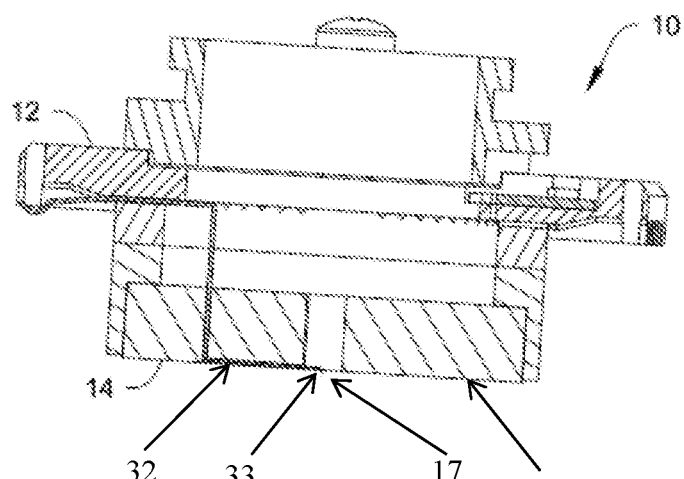

FIGS. 1A-1C show an embodiment of test equipment that can be used in a system to test devices, such as for example semiconductor devices, including but not limited to semiconductor wafers or other MEMS devices. Generally, a circuit board and a probe card can be used to electrically probe a semiconductor device, such as a semiconductor wafer. The probe card contacts the circuit board. The probe card has probe wires that can probe the device to be tested and transmit signals from the probe card to the circuit board. The circuit board transmits signals from the probe card for example to other testing equipment.

Unless specifically indicated otherwise, FIGS. 1A-1C will be referenced generally.

FIGS. 1A-1C show an embodiment of a probe card 10. The probe card 10 has a wire guide 16. A probe tile 14 is connected with the wire guide 16. The wire guide 16 provides a groove pattern 12 for probe wires to be configured into a contact pattern for example, for contacting a circuit board.

A plurality of probe wires 30 are supported by the wire guide 16 and probe tile 14. The plurality of probe wires 30 includes probe wires 30A and probe wires 30B. The plurality of probe wires 30A are generally arranged at corners of the probe card 10 and extend a distance further from the center of the probe card 10 than a distance of the probe wires 30B from the center of the probe card 10. That is, the probe wires 30B have a smaller radius than the probe wires 30A. The probe wires 30A may be referred to as high voltage probe wires 30A, while the probe wires 30B may be referred to as the low voltage probe wires 30B.

The probe wires 30A have a specific orientation so that a standard probe card (e.g., not intended for high voltage testing) cannot inadvertently receive a high voltage. In such a situation, the standard probe card would not contact the high voltage source on the circuit board. The probe wires 30 provide the probing function of the probe card 10. Each probe wire 30 includes a probe needle 32 with a probe tip 33 that extends through the probe tile 14. For example, the probe needles 32 and tips 33 may be disposed toward the center of the probe tile 14, where the tips are exposed from the probe tile 14 generally at the center of the probe tile 14, such as at opening 17. It is to be appreciated that the tips 33 can be appropriately arranged in various configurations and various needle/tip arrays so as to accommodate a device to be tested.

Each probe wire 30 includes a signal transmitting portion and an optional guard portion exposed from the wire guide 16. The signal transmitting portions and the guard portions form a contact pattern on one side of the probe card 10 within the groove pattern 12 of the wire guide 16. The contact pattern of the signal transmitting portions and the guard portions, matches the contact pattern of a circuit board.

Further description and illustration of a wire guide, probe tile, and probe wires is in pending U.S. Pat. No. 8,674,715, the entirety of which is incorporated by reference herein. In an embodiment, the probe tile 14 is constructed of a different material than the wire guide 16. For example, the probe tile 14 is a dielectric material and may be composed of a ceramic material for example.

The probe card 10 also includes a connector structure on the other side from where the groove pattern 12 of the wire guide 16 is located, and thus the other side from where the contact pattern of the probe wires 30 is formed.

In the illustrated embodiment, an insulation layer 50 is formed on a device facing surface of the probe tile 14. In an embodiment, the insulation layer 50 can be multi-layered. A thickness t (FIG. 1B) of the insulation layer 50 can vary. In an embodiment, the insulation layer 50 can be at or about 5 μm or thicker than 5 μm. In an embodiment, the insulation layer 50 can be at or about 5 μm to at or about 25 μm. In an embodiment, the insulation layer 50 can be at or about 5 μm to at or about 25 μm. In an embodiment, the insulation layer 50 can be from at or about 25 μm to at or about 50 μm. A thickness of the insulation layer 50 can be based on a design of the probe wires 30 and the probe tips 33. For example, the thickness t is less than a length of the probe tips 33 such that the probe tips 33 extend through the insulation layer 50. If the insulation layer 50 is too thin, the insulation layer 50 may not adequately prevent a spark from forming. If the insulation layer 50 is too thick, the probe tips 33 may need to be redesigned to ensure the probe tips 33 extend through the insulation layer 50.

The insulation layer 50 can form a barrier between the probe needles 32 and the test site (on the device under test). That is, the insulation layer 50 may be installed such that the probe tips 33 extend between the insulation layer 50 and the device under test, but the remaining features of the probes (e.g., the probe needles 32) are shielded from the device under test by the insulation layer 50.

In an embodiment, the insulation layer 50 can be formed of a material that can prevent a spark from being generated. In an embodiment, the insulation layer 50 can include a polyimide sheet. In an embodiment, the polyimide sheet can be, for example, a Kapton® sheet, commercially available from E.I. du Pont de Nemours and Company. It is to be appreciated that this material is an example, and that other materials suitable to function according to the principles in this Specification, are contemplated.

The probe tile 14 includes a plurality of apertures 60 through which a fluid flow (F in FIGS. 2A-2C) can be provided to a test site. A number of apertures 60 and geometry of the apertures 60 is not intended to be limiting. The number and geometry of the apertures 60 can be selected to, for example, ensure adequate fluid is provided to a fluid pocket (fluid pocket 140 in FIGS. 2A-2C). A seal 65 is disposed on a test facing side of the probe tile 14. The seal 65 can form a perimeter of a fluid pocket (140 in FIGS. 2A-2C). A material of the seal 65 can be selected so that the seal 65 can contact the device under test without causing damage. In an embodiment, the seal 65 can be an O-ring. In an embodiment, the O-ring can be silicone, ceramic, polytetrafluoroethylene (PTFE), synthetic rubbers, fluoropolymer elastomers, or the like. In an embodiment, the O-ring can have a relatively rectangular cross-section.

Figure 2A:
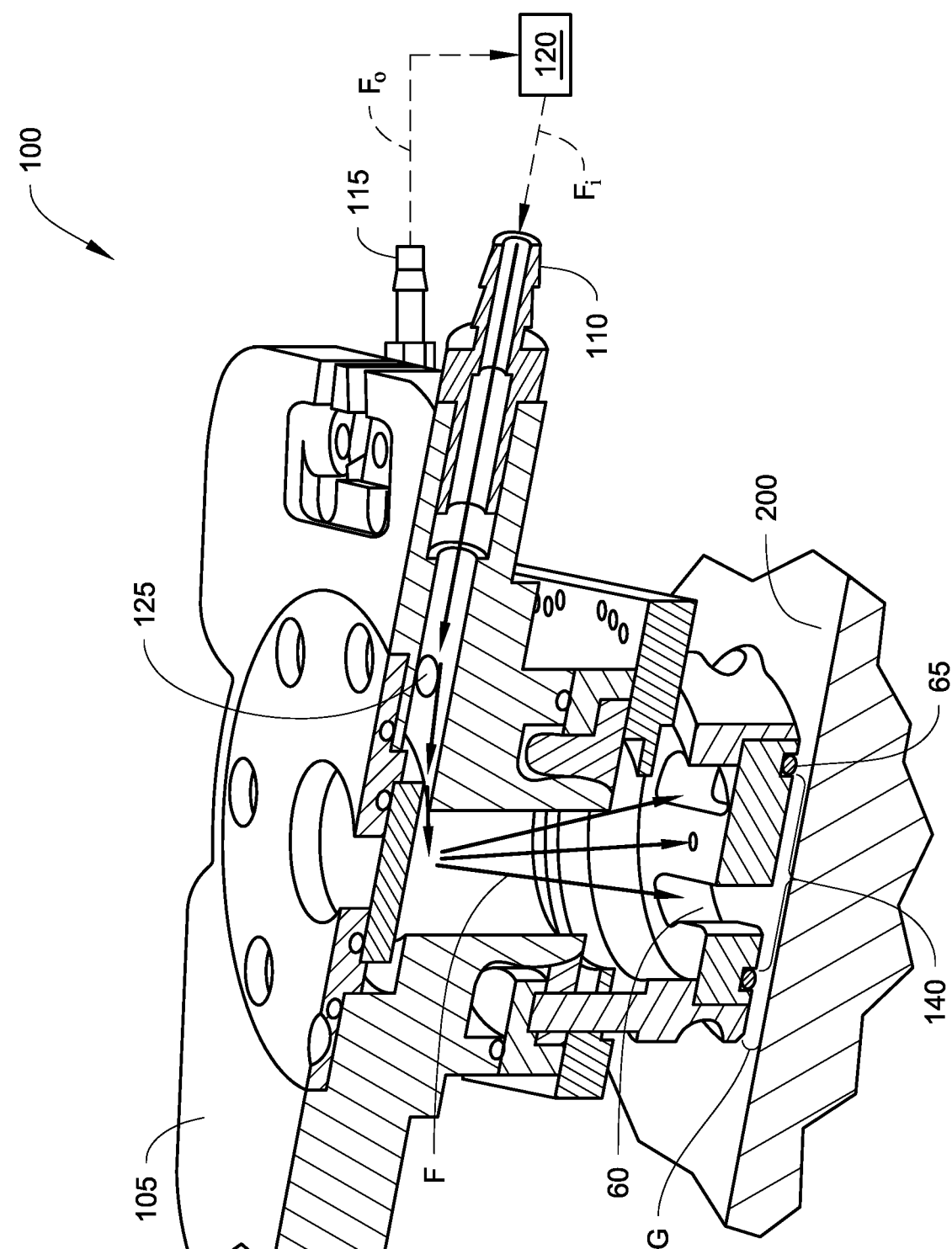
FIGS. 2A-2C illustrate views of a test assembly, according to an embodiment.
Figure 2B:
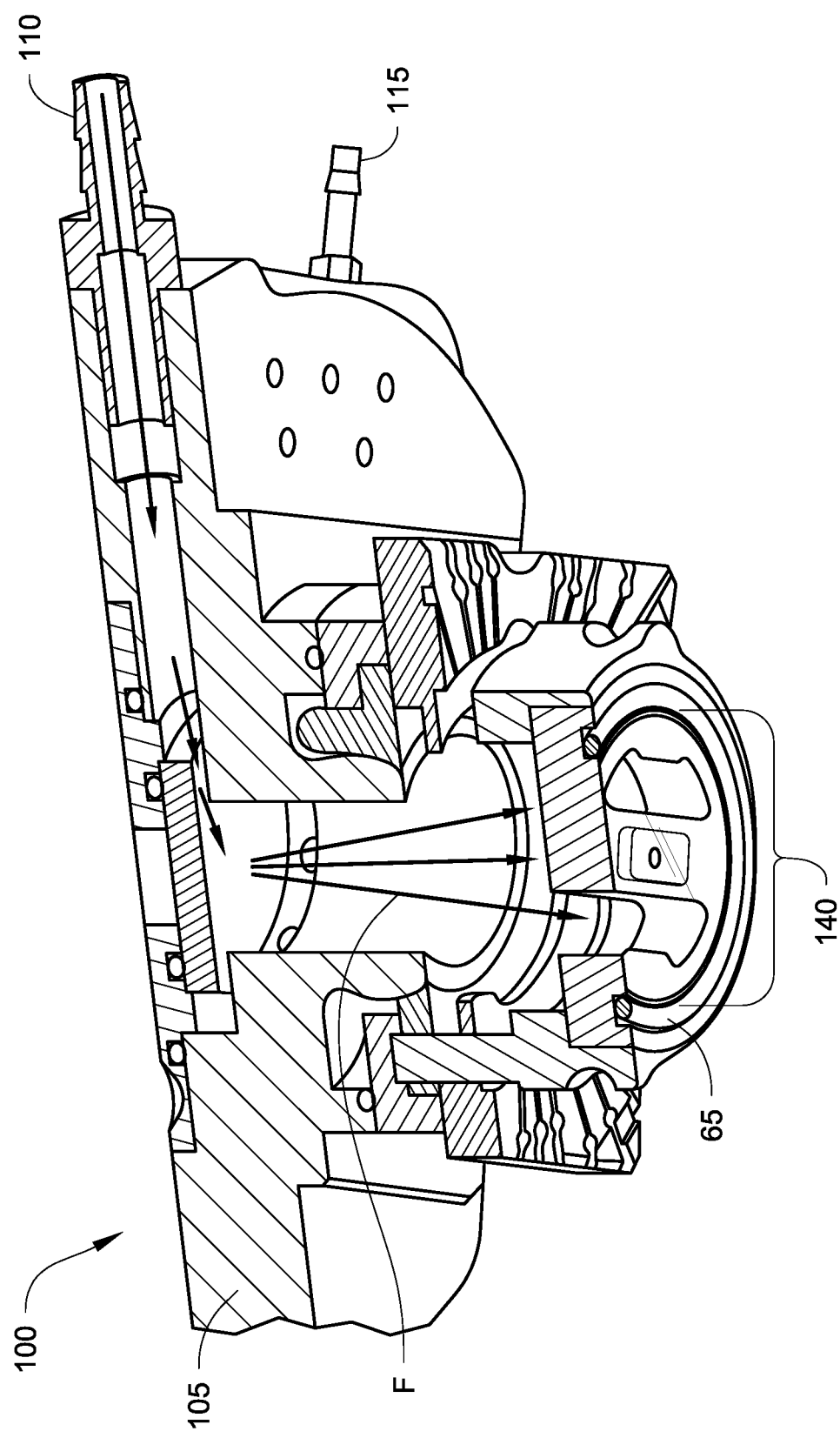
Figure 2C:
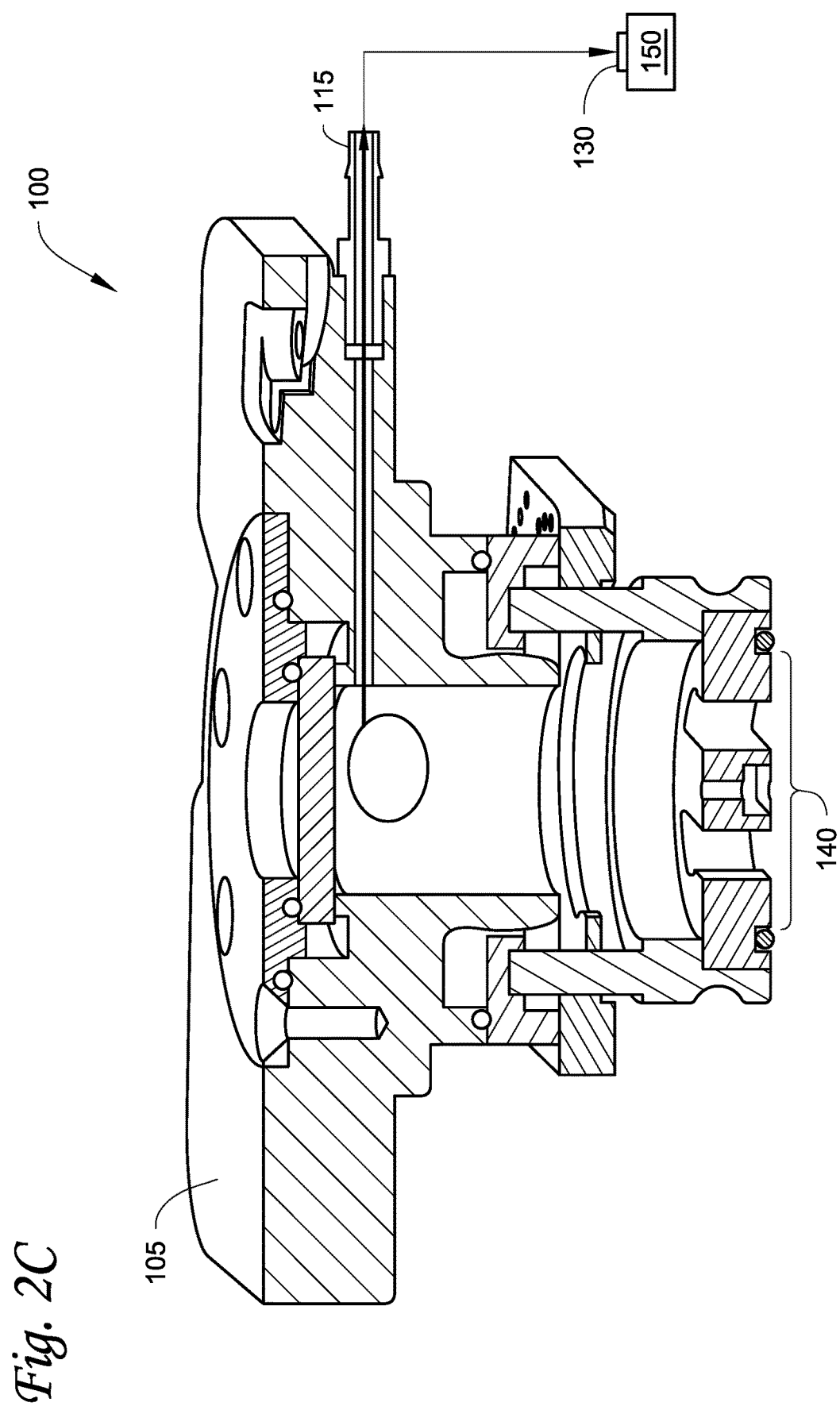

FIGS. 2A-2C show perspective section views of a test assembly 100, according to an embodiment. The test assembly 100 can be used, for example, to conduct high voltage testing of a device under test. In an embodiment, the test assembly 100 can alternatively be referred to as the high voltage test assembly 100 or the like.

The test assembly 100 includes cap 105 and probe card assembly 10 (FIG. 1). The cap 105 is connected to the probe card assembly 10 by, for example, a joint such as, but not limited to, a ball-and-socket joint. In the illustrated embodiment the cap 105 provides the "ball" and the probe card assembly 10 provides the "socket." It is to be appreciated that the cap can provide the "socket" and the probe card assembly can provide the "ball." The joint can be a connection other than a ball-and-socket joint.

In an embodiment, the joint can be any joint by which the cap 105 and probe card assembly 10 are connectable/removable to/from each other without additional tooling.

The joint between the cap 105 and the probe card assembly 10 is a fluid tight connection so that fluid flow being provided via the cap to a site being tested with the probe card assembly 10 can receive the fluid flow and the fluid is prevented from leaking from the joint.

In addition to the ball-and-socket joint, a latch or other locking feature may be included to maintain the cap 105 in a connected state with the probe card assembly 10. The latch can, in an embodiment, provide an increased seal between the cap 105 and the probe card assembly 10 relative to an embodiment, for example, that does not include the latch.

The cap 105 generally includes a fluid inlet 110 and a fluid return outlet 115. The fluid inlet 110 can be fluidly connected to a fluid source 120. The fluid return outlet 115 can also be fluidly connected to the fluid source 120.

In operation, the fluid source 120 can provide a fluid flow F to the fluid inlet 110. The fluid from the fluid source 120 can be provided at a controlled temperature and a controlled flowrate. In an embodiment, the temperature of the fluid can range from at or about −65° C. to at or about 300° C. Within this range, the temperature of the fluid may be selected based on, for example, a desired temperature for the test being performed. Temperatures may vary beyond the stated range. Generally, as temperature increases there may be an increased risk of arcing. As the temperatures are lower, there may be less risk of arcing.

The controlled flowrate can be selected, for example, to control a pressure of a fluid pocket 140 formed near the device under test 200. In an embodiment, the controlled flowrate of the fluid can be from at or about 0 liters per minute (LPM) to at or about 300 LPM. In an embodiment, a standard operating flowrate can be from at or about 30 LPM to at or about 60 LPM. In an embodiment, the fluid can be air. The fluid can be clean dry air (CDA), nitrogen, or the like. In an embodiment, a pressure of the fluid pocket 140 can be controlled. Controlling the pressure can, for example, improve the repeatability of the test.

Fluid from the fluid return outlet 115 can be returned to the fluid source 120, as represented by the dashed arrow $F_o$ in the illustrated embodiment. In an embodiment, the fluid return outlet 115 can include a sensor such as, but not limited to, a flowrate sensor, pressure transducer, or the like, to monitor the flowrate or the pressure of the fluid exiting the fluid return outlet 115. The measurement can be displayed to a user so that the user can adjust the fluid flow.

The seal 65 forms a perimeter of a fluid pocket 140. In the illustrated embodiment, the seal 65 is circular in shape. It will be appreciated that the shape is an example, and that other closed shapes such as, but not limited to, polygonal shapes (e.g., square, rectangular, triangular) or the like.

The fluid flow F provided through the apertures 60 can induce turbulence into the fluid pocket 140 and pressurize the fluid pocket 140. In the illustrated embodiment, a gap G is shown between the device under test 200 and the seal 65. In an embodiment, the gap G can be less than at or about 1 mm. That is, in an embodiment, there may be no gap G between the device under test 200 and the seal 65 (e.g., the seal 65 is in contact with the surface of the device under test 200.

A temperature sensor 125 can be placed in the cap 105. It will be appreciated that the location of the temperature sensor 125 can be located proximate the fluid inlet 110. Generally, the temperature sensor 125 may be disposed at a downstream location that is relatively close to the probe card assembly 10 so that the temperature readings from the temperature sensor 125 reflect the temperature at a location relatively close to the device under test. This can, for example, ensure that the temperature of the fluid flow F (ultimately provided to a location of the probe tips) is more precisely controlled. This placement can be advantageous as temperature requirements for the testing of the device under test may be such that a test temperature should be maintained within a range of plus or minus at or about 3 degrees or less from the desired test temperature.

In an embodiment, the temperature sensor 125 can be included onboard the fluid source 120.

The fluid return outlet 115 can be used to monitor a pressure inside the cavity. In an embodiment, fluid can exit the cap 105 via the fluid return outlet 115. In an embodiment, a pressure transducer 130 can be disposed in a location fluidly connected with the fluid return outlet 115. In an embodiment, the pressure transducer 130 can be disposed onboard a controller 150 for the probe test assembly. The pressure transducer 130 can be used to maintain a pressure of at least at or about 1 bar gauge pressure. The pressure transducer 130 can be used to ensure that a desired pressure is maintained at the fluid pocket 140. In an embodiment, the pressure transducer 130 can be used as a safety mechanism as well. In such an embodiment, the controller 150 for conducting the test may not be able to begin the test until the desired pressure in the fluid pocket 140 is measured. This can, for example, reduce the chance of sparking.

Aspects:

It is to be appreciated that any one of aspects 1-10 can be combined with any one of aspects 11-20.

Aspect 1. A test assembly for testing a device under test, comprising: a probe card assembly, including: a probe tile including a plurality of openings; a plurality of probe wires including a probe needle portion and a probe tip portion; a seal disposed on a surface of the probe tile, the seal forming an outer perimeter of a pressurized area; and an insulation layer formed within the pressurized area, the insulation layer configured to separate the probe needle portion from the device under test, and including an aperture through which the probe tip portion extends to contact the device under test; and a cap secured to the probe card assembly, the cap including: a fluid inlet and a fluid return outlet; the fluid inlet and the fluid return outlet being in fluid communication with the plurality of openings of the probe tile.

Aspect 2. The test assembly of aspect 1, wherein the insulation layer is a polyimide sheet.

Aspect 3. The test assembly of one of aspects 1 or 2, wherein the seal is an O-ring.

Aspect 4. The test assembly of aspect 3, wherein the O-ring is made of one of silicone, ceramic, polytetrafluoroethylene (PTFE), synthetic rubber, and a fluoropolymer elastomer.

Aspect 5. The test assembly of any one of aspects 1-4, further comprising a fluid source, the fluid source being fluidly connected to the one or more of the fluid inlet and the fluid return outlet.

Aspect 6. The test assembly of aspect 5, wherein the fluid source is configured to provide a temperature controlled fluid to the fluid inlet.

Aspect 7. The test assembly of aspect 6, wherein a temperature of the temperature controlled fluid is from at or about −65° C. to at or about 300° C.

Aspect 8. The test assembly of one of aspects 6 or 7, wherein the fluid source is configured to provide the temperature controlled fluid at a flow rate from at or about 0 liters per minute (LPM) to at or about 300 LPM.

Aspect 9. The test assembly of any one of aspects 1-8, further comprising a temperature sensor disposed in the cap.

Aspect 10. The test assembly of any one of aspects 1-9, further comprising a pressure transducer.

Aspect 11. A method of probing devices under test, comprising: positioning a probe card assembly into a test position, which includes retaining a cap to the probe card assembly; providing a temperature controlled fluid from a fluid source to a fluid inlet of the cap, the fluid inlet in fluid communication with one or more apertures in the probe card assembly, thereby forming a fluid pocket at the test position between the probe card assembly and the device under test; probing the device under test; and transmitting signals to a test equipment by way of contact of the probe card assembly with a circuit board and of contact of the probe card assembly with the device under test, thereby allowing signals to be transferred through the probe wires and circuit board.

Aspect 12. The method of aspect 11, wherein the probe card assembly further comprises a seal and an insulation layer for forming the fluid pocket at the test position.

Aspect 13. The method of one of aspects 11 or 12, wherein the temperature controlled fluid is air.

Aspect 14. The method of aspect 13, wherein the air is from at or about −65° C. to at or about 300° C.

Aspect 15. The method of any one of aspects 11-14, wherein the positioning the probe card assembly into the test position includes maintaining a gap between the probe card assembly and the device under test of less than at or about 1 mm.

Aspect 16. The method of aspect 15, further comprising maintaining the gap between the probe card assembly and the device under test to be at or about 50 μm.

Aspect 17. The method of any one of aspects 11-14, wherein the positioning the probe card assembly into the test position includes contacting the probe card assembly to the device under test.

Aspect 18. The method of any one of aspects 11-17, wherein the providing the temperature controlled fluid includes providing the fluid at a flow rate from at or about 0 liters per minute (LPM) to at or about 300 LPM.

Aspect 19. The method of any one of aspects 11-18, further comprising a pressure transducer, and monitoring a pressure in the fluid pocket using the pressure transducer.

Aspect 20. The method of any one of aspects 11-19, further comprising a temperature sensor, and monitoring a temperature of the temperature controlled fluid.

The terminology used in this specification is intended to describe particular embodiments and is not intended to be limiting. The terms "a," "an," and "the" include the plural forms as well, unless clearly indicated otherwise. The terms "comprises" and/or "comprising," when used in this specification, specify the presence of the stated features, integers, steps, operations, elements, and/or components, but do not preclude the presence or addition of one or more other features, integers, steps, operations, elements, and/or components.

With regard to the preceding description, it is to be understood that changes may be made in detail, especially in matters of the construction materials employed and the shape, size, and arrangement of parts without departing from the scope of the present disclosure. This specification and the embodiments described are exemplary only, with the true scope and spirit of the disclosure being indicated by the claims that follow.

Semiconductor Device Not Limitative

The present disclosure is particularly suitable for probing semiconductor devices, but the use of the present teachings is not limited to probing semiconductor devices. Other devices may be applied to the present invention teachings. Thus, while this specification speaks in terms of probing "semiconductor" devices, this term should be interpreted broadly to include probing any suitable device.

What is claimed is:

1. A test assembly for testing a device under test, comprising:
   a probe card assembly, including:
      a probe tile including a plurality of openings;
      a plurality of probe wires including a probe needle portion and a probe tip portion;
      a seal disposed on a surface of the probe tile, the seal forming an outer perimeter of a pressurized area; and
      an insulation layer formed within the pressurized area, the insulation layer configured to separate the probe needle portion from the device under test, and including an aperture through which the probe tip portion extends to contact the device under test; and
   a cap secured to the probe card assembly by a ball-and-socket joint, the cap including:
      a fluid inlet and a fluid return outlet;
      the fluid inlet and the fluid return outlet being in fluid communication with the plurality of openings of the probe tile.

2. The test assembly of claim 1, wherein the insulation layer is a polyimide sheet.

3. The test assembly of claim 1, wherein the seal is an O-ring.

4. The test assembly of claim 3, wherein the O-ring is made of one of silicone, ceramic, polytetrafluoroethylene (PTFE), synthetic rubber, and a fluoropolymer elastomer.

5. The test assembly of claim 1, further comprising a fluid source, the fluid source being fluidly connected to the one or more of the fluid inlet and the fluid return outlet.

6. The test assembly of claim 5, wherein the fluid source is configured to provide a temperature controlled fluid to the fluid inlet.

7. The test assembly of claim 6, wherein a temperature of the temperature controlled fluid is from at or about −65° C. to at or about 300° C.

8. The test assembly of claim 6, wherein the fluid source is configured to provide the temperature controlled fluid at a flow rate from at or about 0 liters per minute (LPM) to at or about 300 LPM.

9. The test assembly of claim 1, further comprising a temperature sensor disposed in the cap and located proximate the fluid inlet at a fluid flow downstream location towards the probe card assembly.

10. The test assembly of claim 1, further comprising a pressure transducer disposed in a location fluidly connected with the fluid return outlet and a controller,
wherein the pressure transducer is disposed onboard the controller.

11. A method of probing devices under test, comprising:
positioning a probe card assembly into a test position, which includes retaining a cap to the probe card assembly by a ball-and-socket joint, wherein the probe card assembly includes a probe tile including a plurality of openings; a plurality of probe wires including a probe needle portion and a probe tip portion; a seal disposed on a surface of the probe tile, the seal forming an outer perimeter of a pressurized area; and an insulation layer formed within the pressurized area, the insulation layer configured to separate the probe needle portion from the device under test, and including an aperture through which the probe tip portion extends to contact the device under test;
providing a temperature controlled fluid from a fluid source to a fluid inlet of the cap, the fluid inlet in fluid communication with one or more apertures in the probe card assembly, thereby forming a fluid pocket at the test position between the probe card assembly and the device under test;
probing the device under test; and
transmitting signals to a test equipment by way of contact of the probe card assembly with a circuit board and of contact of the probe card assembly with the device under test, thereby allowing signals to be transferred through probe wires and the circuit board.

12. The method of claim 11, wherein the probe card assembly further comprises a seal and an insulation layer for forming the fluid pocket at the test position.

13. The method of claim 11, wherein the temperature controlled fluid is air.

14. The method of claim 13, wherein the air is from at or about −65° C. to at or about 300° C.

15. The method of claim 11, wherein the positioning the probe card assembly into the test position includes maintaining a gap between the probe card assembly and the device under test of less than at or about 1 mm.

16. The method of claim 15, further comprising maintaining the gap between the probe card assembly and the device under test to be at or about 50 µm.

17. The method of claim 11, wherein the positioning the probe card assembly into the test position includes contacting the probe card assembly to the device under test.

18. The method of claim 11, wherein the providing the temperature controlled fluid includes providing the fluid at a flow rate from at or about 0 liters per minute (LPM) to at or about 300 LPM.

19. The method of claim 11, further comprising a pressure transducer disposed in a location fluidly connected with a fluid return outlet and disposed onboard a controller, and monitoring a pressure in the fluid pocket using the pressure transducer.

20. The method of claim 11, further comprising a temperature sensor located proximate the fluid inlet at a fluid flow downstream location towards the probe card assembly, and monitoring a temperature of the temperature controlled fluid.

* * * * *